US010950900B2

(12) United States Patent
Hahn et al.

(10) Patent No.: US 10,950,900 B2
(45) Date of Patent: Mar. 16, 2021

(54) TEST CELL STATION FOR AT LEAST ONE ELECTROCHEMICAL TEST CELL

(71) Applicant: EL-CELL GMBH, Hamburg (DE)

(72) Inventors: Michael Hahn, Hamburg (DE); Matthias Hahn, Barsinghausen/Kirchdorf (DE)

(73) Assignee: EL-CELL GMBH, Hamburg (DE)

( * ) Notice: Subject to any disclaimer, the term of this patent is extended or adjusted under 35 U.S.C. 154(b) by 181 days.

(21) Appl. No.: 16/307,397

(22) PCT Filed: Jun. 6, 2016

(86) PCT No.: PCT/EP2016/062782
§ 371 (c)(1),
(2) Date: Dec. 5, 2018

(87) PCT Pub. No.: WO2017/211379
PCT Pub. Date: Dec. 14, 2017

(65) Prior Publication Data
US 2019/0273289 A1    Sep. 5, 2019

(51) Int. Cl.
*H01M 10/42* (2006.01)
*H01M 10/613* (2014.01)
(Continued)

(52) U.S. Cl.
CPC ...... *H01M 10/4285* (2013.01); *G01R 31/385* (2019.01); *H01M 6/5038* (2013.01);
(Continued)

(58) Field of Classification Search
CPC .......... H01M 10/4285; H01M 10/613; H01M 10/615; H01M 6/5038; H01M 6/5083;
(Continued)

(56) References Cited

U.S. PATENT DOCUMENTS 3,876,931 A * 4/1975 Godshalk ............. G01R 31/379
324/429
6,218,843 B1 * 4/2001 Zimmerman ........ G01R 31/385
324/426
(Continued)

FOREIGN PATENT DOCUMENTS

CN    201319060 Y    9/2009
CN    202975311 U    6/2013
(Continued)

OTHER PUBLICATIONS

International Search Report and Written Opinion for International Patent Application No. PCT/EP2016/062782 (published Application No. WO 2017/211379 A1), pp. 1-9.

*Primary Examiner* — Lee E Rodak
*Assistant Examiner* — Feba Pothen
(74) *Attorney, Agent, or Firm* — Saliwanchik, Lloyd & Eisenschenk

(57) ABSTRACT

A test cell station (50) for at least one electrochemical test cell (10), comprising a housing (57), at least one receptacle (51) for the contacting insertion of at least one electrochemical test cell (10) and electrical connection means (54) for the electrical connection of a test cell (10) that has been inserted into the receptacle (51), characterized in that a thermally insulated temperature chamber (20) with a controllable cooling/heating device (27) for adjusting a temperature in the temperature chamber (20) is integrated into the test cell station (50), wherein the receptacle (51) is arranged in the test cell station (50) in such a way that the corresponding receptacle space for the electrochemical test cell (10) is arranged within the temperature chamber (20).

15 Claims, 5 Drawing Sheets

Figure 1:
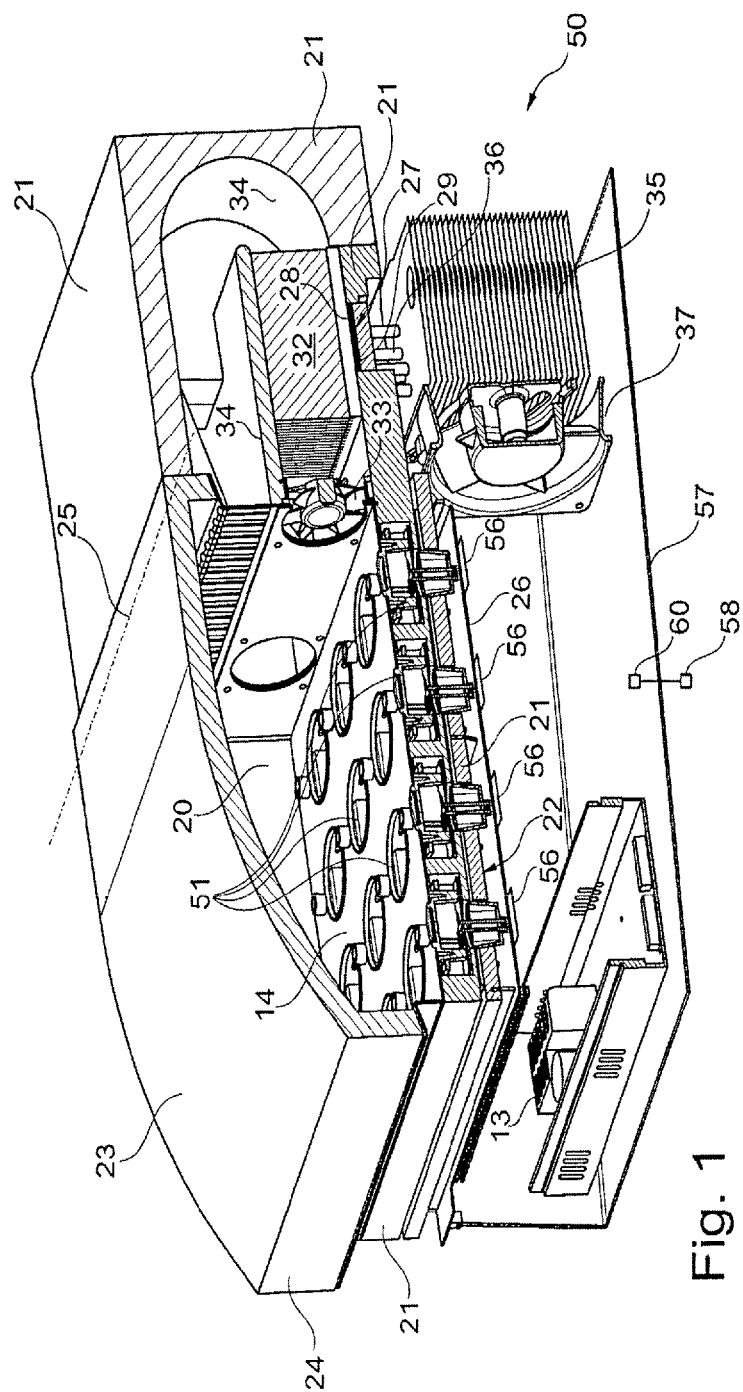

(51) Int. Cl.
*H01M 10/615* (2014.01)
*H01M 6/50* (2006.01)
*H01M 10/48* (2006.01)
*G01R 31/385* (2019.01)

(52) U.S. Cl.
CPC ......... *H01M 6/5083* (2013.01); *H01M 10/48* (2013.01); *H01M 10/486* (2013.01); *H01M 10/613* (2015.04); *H01M 10/615* (2015.04)

(58) Field of Classification Search
CPC .. H01M 10/48; H01M 10/486; H01M 10/617; H01M 10/65; H01M 10/653; H01M 10/658; H01M 10/60; G01R 31/385; G01R 31/374; G01R 31/36
See application file for complete search history.

(56) References Cited

U.S. PATENT DOCUMENTS

| | | |
|---|---|---|
| 8,658,299 B2 | 2/2014 | Yang et al. |
| 9,954,255 B2* | 4/2018 | Hopkins ........... H01M 10/4285 |
| 2004/0086780 A1* | 5/2004 | Ebermann .......... H05K 7/20609 |
| | | 429/120 |
| 2011/0232302 A1* | 9/2011 | Dallinger .......... H01M 10/4285 |
| | | 62/3.7 |
| 2012/0282497 A1 | 11/2012 | Yang et al. |
| 2016/0131701 A1 | 5/2016 | Marcicki et al. |

FOREIGN PATENT DOCUMENTS

| | | |
|---|---|---|
| DE | 10 2012 206 917 A1 | 11/2012 |
| DE | 10 2015 118 454 A1 | 5/2016 |

* cited by examiner

TEST CELL STATION FOR AT LEAST ONE ELECTROCHEMICAL TEST CELL

CROSS REFERENCE TO RELATED APPLICATIONS

This application is a National Stage Application of International Application Number PCT/EP2016/062782, filed Jun. 6, 2016.

The invention concerns a test cell station for at least one electrochemical test cell comprising a housing, at least one receptacle for the contacting insertion of at least one electrochemical test cell and electrical connection means for electrically connecting a test cell inserted into the receptacle.

In the research and development of electrochemical storage cells, for example, lithium-ion batteries, electrochemical test cells are used to characterize the battery materials. The test cells have external electrical terminals connected to internal electrodes in alternating electrolytic contact. For measurement, the test cells are inserted and locked into corresponding receptacles in a test cell station, creating an electrical contact between the external terminals and electrical connection means, via which the test cells may be connected to a battery testing device. Via the external terminals, the battery testing device records electrical characteristic curves to characterize the battery materials used, e.g. characteristic current/voltage curves, constant current cycles, impedance spectra.

A test cell station of the applicant for up to 16 test cells is known under the name PAT-Tray. Since the measurement is to be carried out under defined temperature conditions, it is known to place the test cell station during the measurement in a separate, lockable temperature chamber in the manner of a refrigerator. The test cell station is connected to an external battery tester, which is located outside the temperature chamber, via a complex cable feed-through through the temperature chamber to the outside via a number of cables corresponding to the number of test cell receptacles. When electrically testing the cells, it may be necessary to change the individual connections between the terminals of the test cell and the corresponding terminals of the assigned battery tester channel. Such changes to the test cell circuitry are made manually and are documented manually, which is time-consuming and error-prone.

The task of the invention is to provide a further improved test cell station for testing high throughput electrochemical cells.

The invention solves the problem with the features of the independent claims. The invention provides a test cell station as an integrated device with the function of a docking station for the test cells and a temperature chamber. Due to the integration of the temperature chamber into the test cell station, a separate temperature chamber is not necessary, which significantly reduces the overall costs.

A battery testing device with a controllable potentiostat and/or galvanostat is integrated into the test cell station for each test cell in a preferred embodiment. This embodiment eliminates the need for time-consuming and error-prone individual cabling between the docking station and an external battery testing device by the operator and thus also the measurement artefacts caused by the cabling.

The battery testing device is preferably located in the housing outside the temperature chamber.

Advantageously, each battery testing device has a controllable electronic switching matrix, in particular in the form of a plurality of switches, such as semiconductor switches or relays, with which the terminals of the respective potentio/galvanostats (a working, counter-, or reference electrode) may be connected arbitrarily to the terminals of the corresponding test cell (anode, cathode, reference electrode). This means that error-prone and time-consuming manual changes to the test cell wiring by reconnecting electrical cables can be eliminated.

Each battery testing device advantageously includes a digital control device for controlling the corresponding potentio/galvanostat and/or the corresponding switching matrix. Automatic documentation of the test cell wiring and/or data recording is also easily possible using the control device.

In a simple and therefore advantageous embodiment, the cooling/heating device is a Peltier element or an electrothermal converter, whereby one thermal side (in cooling mode the cooling side) is connected to the interior and the other thermal side (in cooling mode the warm side) is connected to the exterior of the temperature chamber. However, it cannot be ruled out that the cooling/heating equipment is, for example, a refrigerating machine operating with a refrigerant, in particular a compressor or absorber refrigerating machine.

A thermally insulated, adjustable flap for opening or closing a housing opening in the temperature chamber, i.e. pivotable and/or displaceable, is advantageously arranged on the housing. When the flap is open, this allows for easy and quick insertion or removal of test cells into or out of the temperature chamber through the housing opening and, when the flap is closed, the measurement can be performed without delay. In another advantageous embodiment, the docking station with the test cell receptacles is arranged in a sliding element that can be pulled out of the housing and inserted again, having a thermally insulated front wall. This allows for a quick and easy insertion and removal of test cells into and out of the temperature chamber when the sliding element is pulled out, and for a delay-free execution of the measurement when the sliding element is pushed in.

The electrical connection between a circuit board arranged inside the housing and the test cell may be made advantageously using double-acting spring contact pins, one end of which is adapted for spring-loaded contacting of contact points on the test cell and the other end for direct spring-loaded contacting of contact points on the circuit board. This eliminates the need for conventional cable terminals at this point.

The test cell according to the invention is advantageously intended for the research and development of electrochemical storage cells, in particular of electrochemical secondary cells or secondary batteries including so-called coin cells, primary electrochemical cells and electrochemical capacitors, for example, double layer capacitors.

Figure 2:
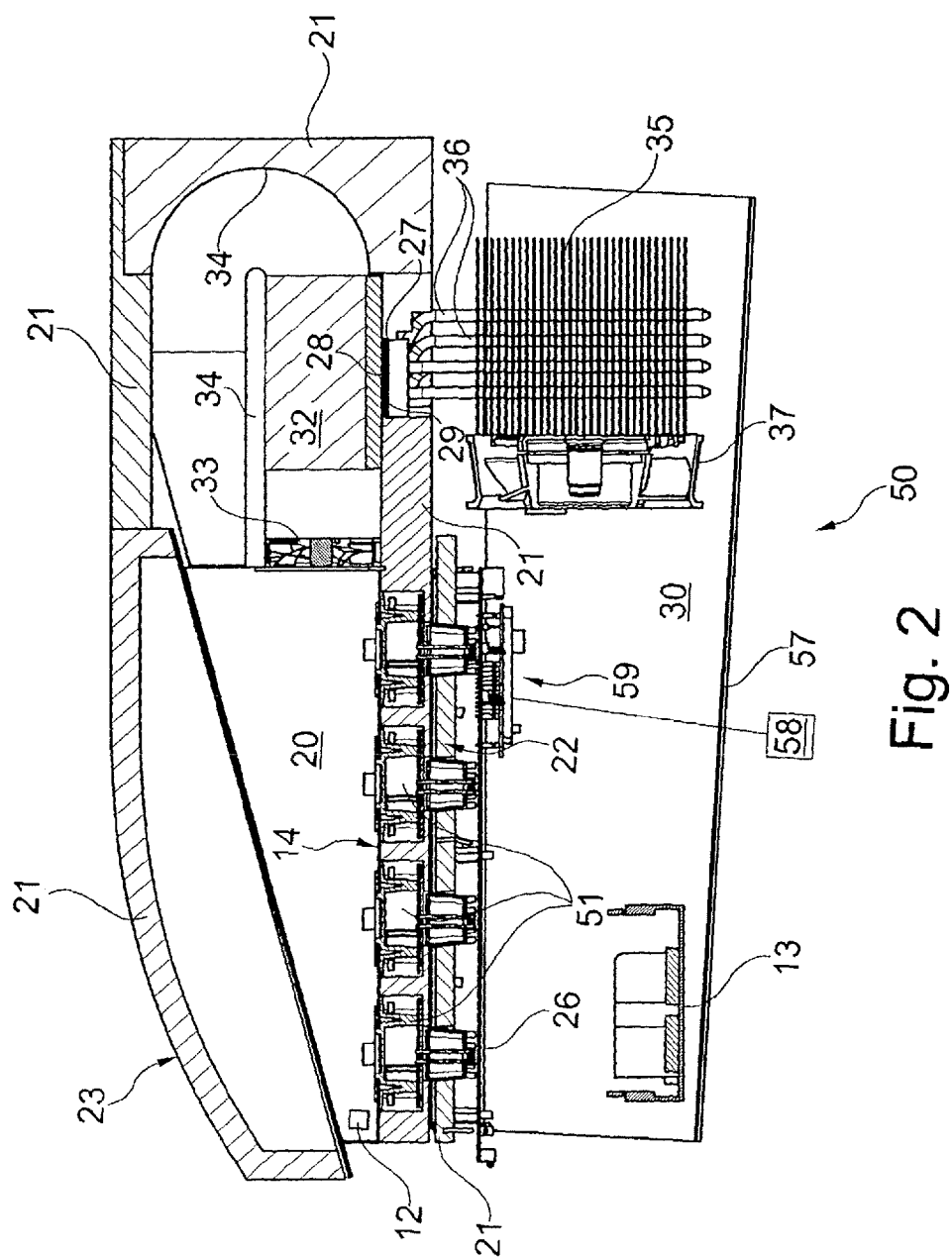
Figure 3:
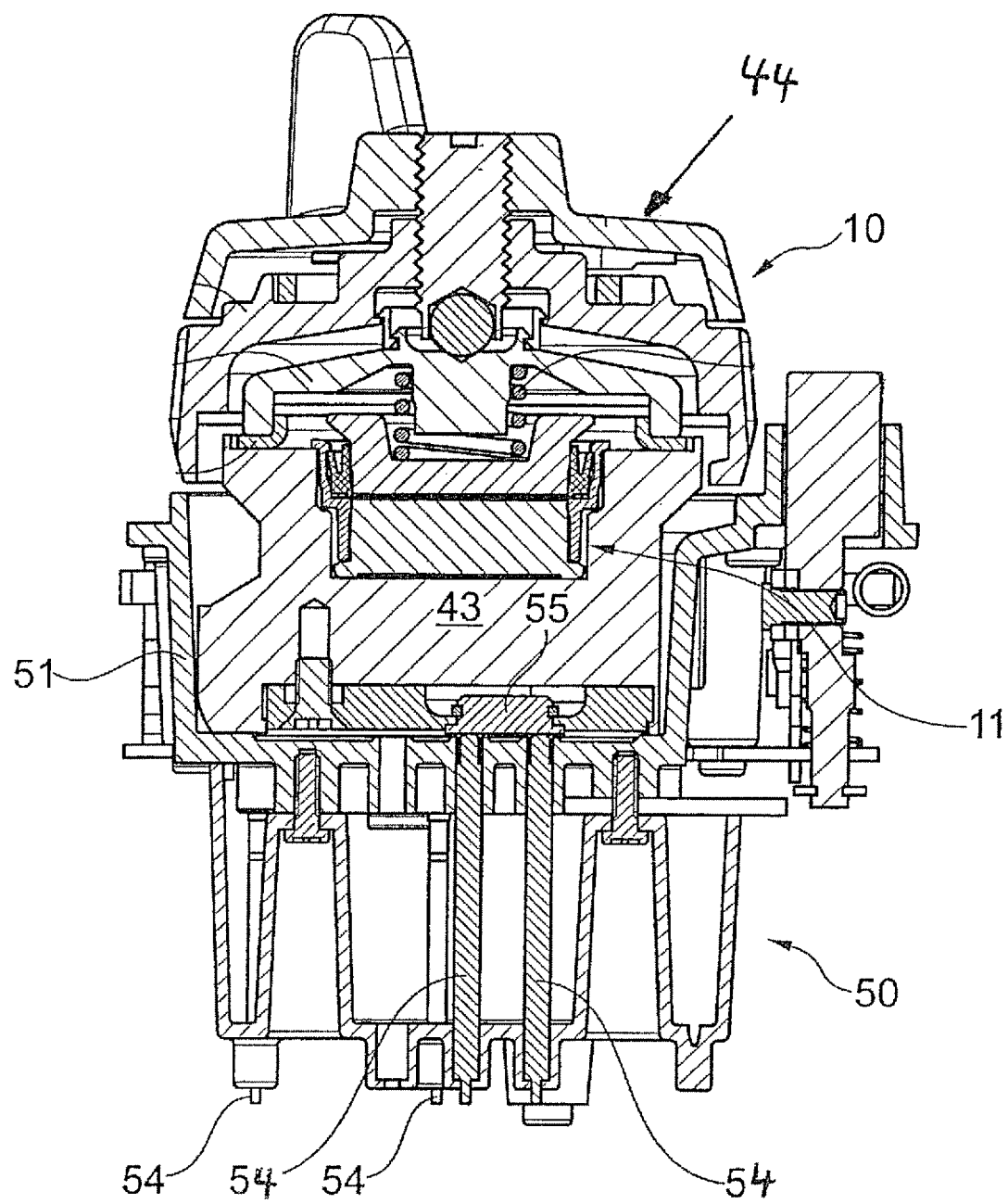
Figure 4:
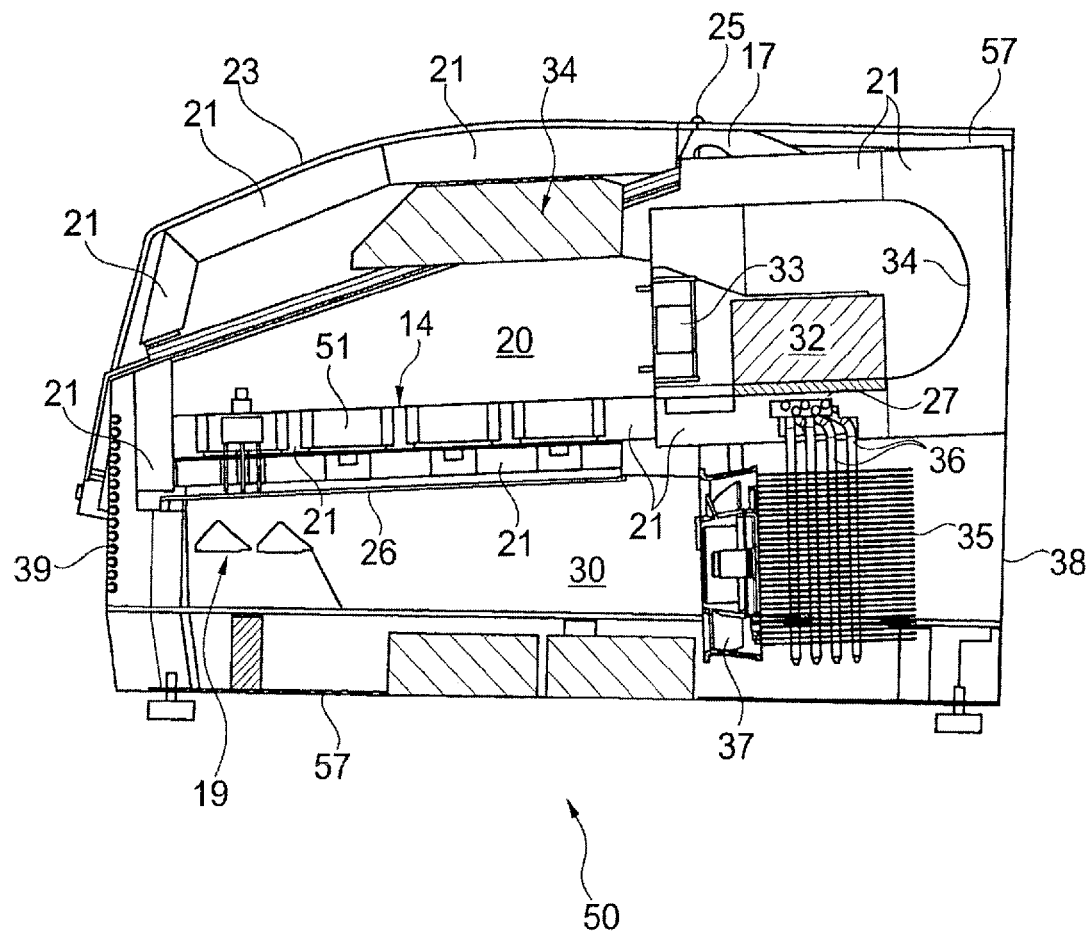

In the following, the invention will be explained on the basis of preferred embodiments with reference to the enclosed figures. The figures show as follows:

FIG. 1 a perspective view of a test cell station for receiving a plurality of electrochemical test cells;

FIG. 2 a cross-sectional view of the test cell station from FIG. 1;

FIG. 3 a cross-sectional view of a test cell image with an inserted electrochemical test cell;

FIG. 4 a perspective view of another inventive test cell station; and

Figure 5:
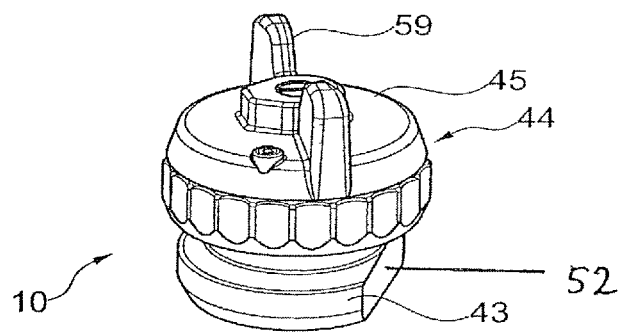

FIG. 5, 6 oblique perspective views of an electrochemical test cell from above and below.

The test cell station 50 as shown in FIGS. 1, 2, and 4 comprises a housing 57 and a thermally insulated temperature chamber 20 with a plurality of—in this case—sixteen receptacles 51, each for an electrochemical test cell 10. The temperature chamber 20 is formed by insulating elements or walls 21 made of a thermally insulating material, see in particular FIG. 4, which may be partially arranged on the inside of the housing 57. Advantageously, a flap 23 is captively attached to the housing 57 and adjustable between an open position and a closed position. In FIGS. 1, 2, and 4, flap 23 is in the closed position.

Flap 23 advantageously has an operating handle 24 and is pivotable about a horizontal pivot axis 25 preferably located at the rear of flap 23, for which purpose it is attached to the pivot bearing 17, see FIG. 4. When the flap 23 is fully pivoted upwards and opened (open position), a service opening opens up in the housing 57, the service opening being sufficiently dimensioned and arranged to allow an operator to insert and remove electrochemical test cells 10 into and from the temperature chamber 20.

The receptacles 51 are advantageously arranged in a horizontal, in this case thermally insulated partition wall 22 in the housing 57 and may, for example, consist of plastic. FIG. 4 shows a test cell receptacle 51 with an inserted test cell 10 in cross-section. The test cell 10 may be inserted into the receptacle 51 at a specified orientation, which may be achieved, for example, by shaping the receptacle 51 in conjunction with an appropriately shaped base 43 of the test cell 10, in this case a flat lateral surface 52, or by using another orientation means.

In its inserted state, a cell can be fixed in the corresponding receptacle 51 by means of a non-displayed locking mechanism. The totality of the receptacles 51 thus forms a uniform docking station 14 for electrochemical test cells 10. When fixed inside the respective receptacle 51, the test cells 10 are arranged completely or essentially completely within the temperature chamber 20.

Below the receptacle 51, double-acting spring contact pins 54 are provided, which, when the cell 10 is inserted into *the receptacle 51, bear on the one hand under spring bias against the external contact terminals 40, 48, 49, 55 of the cell 10, and on the other hand under spring bias against contact points of a circuit board 26 provided in the test cell station 50. By means of the double-acting spring contact pins 54, interfering and vulnerable cable terminals can be avoided. The spring contact pins 54 are guided through the temperature chamber wall or the insulating elements 21 in order to generate the electrical connection between the test cells that are arranged in the temperature chamber 20 and in the exterior space 30. In this embodiment, the test cells are thus thermally insulated from the circuit board 26.

The housing 57 of the test cell station 50 preferably contains a power supply unit for the voltage/power supply of the electrical equipment. In the test cell station 50, a strain relief 19 may be provided for electrical cables, see FIG. 4.

In the test cell station 50, a battery testing device 56 is advantageously provided for each test cell receptacle 51. In FIG. 1 the battery testing device 56 is schematically drawn only for the frontmost four test cell receptacles 51. Each battery testing device 56 has a potentiostat/galvanostat, a switching matrix, a digital control device, in particular, a microcontroller or microprocessor, and/or a data memory. Each battery testing device 56 may be arranged on a separate circuit board (channel board). Alternatively, a single circuit board solution is also conceivable for all, in this case sixteen, battery testing devices 56, either in the form of a separate circuit board or integrated into the circuit board 26. The battery testing devices 56 may be connected to one another via an internal data bus.

The battery testing devices 56 also serve to record the measurement data by measuring the currents and voltages at the cells 10 and transferring the results to an external database server 58, for example via a USB or LAN connection via an internal interface device 60, where they may be stored and/or visualized. The interface device 60 may be designed as a single-board EPC computer, for example.

To carry out battery tests, the electrochemical cells 10 must be kept at a predefined measuring temperature. In order to set and maintain a desired temperature in the temperature chamber, a cooling/heating device 27 is provided, having a cooling surface 28 that is arranged and adapted for dissipating cold or heat into the interior of the temperature chamber 20. The cooling/heating device 27 is preferably a thermoelectric transducer, in particular a Peltier element, which is advantageously arranged in a thermally insulating wall 21 of the temperature chamber 20, so that one side 28 of the Peltier device 27 is thermally connected to the interior of the temperature chamber 20 and the opposite side 29 is thermally connected to the exterior 30 of the temperature chamber 20.

The power supply unit is designed to supply current or voltage to the Peltier element 27 and the electronics in the test cell station 50. Depending on the polarity, the side 28 of the Peltier element 27 facing the temperature chamber 20 or the side 29 facing away from it is cooled, while the respective opposite side 29 or 28 is heated by the waste heat from the Peltier element 27. In the following, it is assumed, without limitation, that the Peltier element 27 is operated in cooling mode, i.e. that side 28 of the Peltier element 27 facing the temperature or cooling chamber 20 is cooled by the respective polarity of the power supply. The side 28 of the Peltier element 27 facing the cooling chamber 20 is, therefore, referred to below as the cooling side, although it can also be operated as the heating side by reversing the polarity. The adjustable temperatures lie within a temperature range which preferably spans at least 50° C., for example the range from −10° C. to +80° C.

In order to dissipate the cold generated by the Peltier element 27 more effectively into the air in the temperature chamber 20 and thus increase the cooling efficiency, the cooling side 28 of the Peltier element 27 is advantageously connected to a cooling element 32 extending into the temperature chamber 20, made of a material with high thermal conductivity, e.g. aluminium. To distribute the cooled air more effectively in the temperature chamber 20 and thus to further increase the cooling efficiency, an electric fan 33 is preferably provided in the temperature chamber 20, which is arranged in such a way that the air flow generated by the fan 33 passes the cooling element 32 for cold absorption on the one hand and the test cell receptacles 51 or electrochemical cells 10 for cold dissipation on the other hand. The electric fan 33 may, for example, be attached to the cooling element 32. For improved cooling air distribution, air baffles 34 may also be advantageously provided in the temperature chamber 20.

In order to dissipate the waste heat generated by the Peltier element 27 more effectively into the environment, the warm side 29 of the Peltier element 27 is advantageously connected to a cooling element 35 made of a material with high thermal conductivity, e.g. aluminium, which extends outside the temperature chamber 20, in a heat-conducting manner, e.g. via heat pipes 36 (so-called heat pipes). In order to dissipate waste heat more effectively, an electric fan 37 is preferably provided in the exterior space 30, arranged such that the air flow generated by the fan 37 passes the cooling element 35 for heat absorption. The electric fan 37 may in particular be fastened to the cooling element 35. In the housing 57, a supply air opening 38, for example in the rear wall, is advantageously provided for supplying cooler ambient air, and an exhaust air opening 39, for example on the front side, is advantageously provided for dissipating the warm air flow from the housing 57. The cooler supply air passes advantageously over the electronic components 13, 26, 56 in outer space 30 to cool them or to dissipate their waste heat as well.

In order to regulate the temperature in the temperature chamber 20 at a desired value, preferably a thermostat 13 shown only schematically in FIG. 2 is provided, which regulates the power supply of the Peltier element 27 depending on a temperature measured with at least one temperature sensor 12 arranged in the temperature chamber 20. The thermostat 13, for example, may be controlled by the control device 56.

Figure 6:
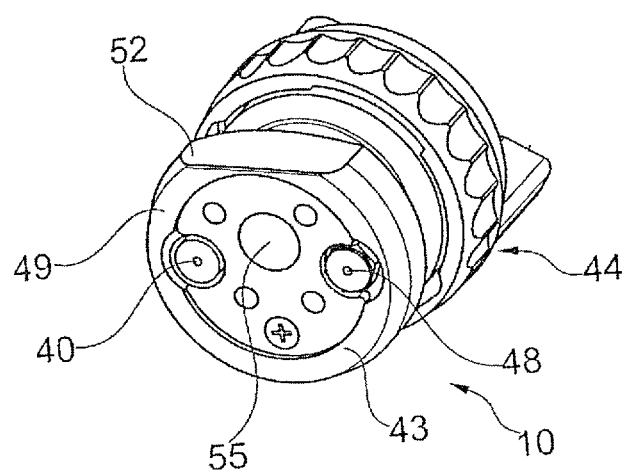

An electrochemical test cell 10 according to FIGS. 5 and 6 referred to as PAT cell comprises a hermetically sealed internal cell 11 which is acted upon by a defined force of a few Newtons and is hermetically sealed to the outside, comprising a reference electrode in contact with a reference material, for example, metallic lithium, a working electrode and a general electrode, all the electrodes being in electrolytic contact with one another. The test cell 10 in this embodiment also comprises a preferably metallic base 43 and a cover arrangement 44. External electrical terminals are provided in the base 43 of the test cell 10, namely a reference connection 40 connected to the reference electrode, a contact connection 48 connected to the working electrode and a contact connection 49 connected to the counter-electrode, here formed by the base 43.

Preferably, a metallic contact element 55, for example, a contact button made of stainless steel, is provided on the underside of the test cell 10, which short-circuits two double-acting spring contact pins 54 when the cell 10 is inserted into the receptacle 51. In this way, the presence of a test cell 10 in a receptacle 51 may be easily detected.

In a preferred embodiment called the PAT cycler, the battery testing devices 56 with a potentiostat and/or galvanostat are integrated into the test cell station 50. For example, the electronics 56 of a battery tester channel with a potentiostat and/or galvanostat are arranged under each receptacle 51 for a test cell 10, see FIG. 1. The voltages or currents generated by the battery testing device are applied to the electrodes of the test cells 10 via the connection means 54 and the external terminals 40, 48, 49 in order to record charging or discharging curves of the electrochemical cell 10 and to carry out impedance measurements. The circuit board 26 serves, in particular, to transmit the voltages or currents from the battery testing devices 56 to the test cells 10. An interface device 60, for example, an internal file server, serves to transmit the data from the battery testing devices 56 to an external database server 58.

Preferably the battery testing devices 56 are located in the housing 57 in the exterior space 30. Due to the arrangement in housing 57, the time-consuming and error-prone individual wiring between the docking station 14 and an external battery tester by the operator and thus also the measurement artefacts resulting from the wiring are no longer necessary.

In a different embodiment, called PAT chamber, the battery testing device is not integrated into the test cell station 50 but is an external unit that may be connected to the test cell station 50 via a cable connection. In this version, a data logger 59 for recording charging characteristics and sensor signals is preferably integrated into the housing of the test cell station 50 and may be advantageously connected to an external database server 58. An external data logger known from prior art and the corresponding connection cables from the external data logger to the test cell station 50 are then dispensable.

Advantageously, each battery testing device 56 has a controllable electronic switching matrix, in particular in the form of a plurality of switches, for example, semiconductor switches or relays, with which the terminals of the respective potentio/galvanostat (working, counter, reference electrode) may be connected arbitrarily to the terminals 40, 48, 49 of the corresponding test cell (anode, cathode, reference electrode). Examples for different test cell circuits, which may be adjusted by means of the switching matrix, are in potentiostatic (cv) operation: constant cell voltage; constant cathode potential; constant anode potential; charge of the reference electrode against the cathode; charge of the reference electrode against the anode. In galvanostatic (cc) operation: constant cell current; charge of reference electrode against cathode galvanostatic; charge of reference electrode against anode galvanostatic. The electronically controlled switching by means of the switching matrix allows error-prone and time-consuming manual changes of the test cell wiring by reconnecting electrical cable traps. Documentation of the test cell wiring is also easily possible via computer control.

According to the above, the receptacles 51 or the docking station 14 are permanently mounted in the temperature chamber 20. In other words, the docking station 14 and the temperature chamber 20 are integrated into a single device, the test cell station 50.

In the embodiment shown in FIGS. 1, 2 and 4, the housing 57 advantageously encloses essentially two subregions, namely the thermally insulated temperature chamber 20 for the test cells 10 on the one hand, and the exterior space 30 for electronic components such as power supply unit, thermostat 13, the circuit board 26 and/or control device 56, on the other hand. It is conceivable to alternatively arrange individual or all of these electronic components in the temperature chamber 20. It is also conceivable that the partition wall 22 is not thermally insulated and instead the bottom of the housing 57 is thermally insulated. However, at least the warm side 29 of the Peltier element and the cooling element 35 are advantageously arranged in thermal connection with the exterior 30 of the temperature chamber 20, and not with its interior space.

EMBODIMENTS

Embodiment 1. Test cell station (50) for at least one electrochemical test cell (10), comprising a housing (57), at least one receptacle (51) for the contacting insertion of at least one electrochemical test cell (10) and electrical connection means (54) for the electrical connection of a test cell (10) inserted into the receptacle (51), characterized in that the test cell station (50) has a heat-insulated temperature chamber (20) with a controllable cooling/heating element, in that a thermally insulated temperature chamber (20) with a controllable cooling/heating device (27) for setting a temperature in the temperature chamber (20) is integrated into the test cell station (50), the receptacle (51) being arranged in the test cell station (50) in such a way that the corresponding receiving space for the electrochemical test cell (10) is arranged inside the temperature chamber (20).

Embodiment 2. Test cell station according to claim 1, characterized in that a battery testing device (56) with a controllable potentiostat and/or galvanostat is integrated into the test cell station (50) for each receptacle (51).

Embodiment 3. Test cell station according to claim 2, characterized in that the battery testing device (56) is arranged in the housing (57) outside the temperature chamber (20).

Embodiment 4. Test cell station according to claim 2 or 3, characterized in that each battery testing device (56) has a controllable electronic switching matrix with which the terminals of the potentio-/galvanostat may be connected arbitrarily to the terminals of the corresponding test cell receptacle (51).

Embodiment 5. Test cell station according to one of claims 2 to 4, characterized in that each battery testing device (56) comprises a digital control device for controlling the potentio-/galvanostat and/or the switching matrix.

Embodiment 6. Test cell station according to one of the preceding claims, characterized in that the cooling/heating device (27) is a Peltier element, one thermal side (28) being in thermal communication with the interior and the other thermal side (29) being in thermal communication with the exterior of the temperature chamber (20).

Embodiment 7. Test cell station according to claim 6, characterized in that a cooling element (32, 35) which is thermally conductively connected to the respective thermal side (28, 29) of the Peltier element is provided in the interior and/or in the exterior of the temperature chamber (20).

Embodiment 8. Test cell station according to claim 7, characterized in that a fan (33, 37) assigned to the respective cooling element is provided in the interior and/or in the exterior of the temperature chamber (20).

Embodiment 9. Test cell station according to one of the preceding claims, characterized in that at least one temperature sensor (12) and one thermostat (13) are provided for controlling the cooling/heating device (27).

Embodiment 10. Test cell station according to one of the preceding claims, characterized in that a thermally insulated, adjustable flap (23) for opening or closing a housing opening in the temperature chamber (20) is attached to the housing (57).

Embodiment 11. Test cell station according to one of the preceding claims, characterized in that the at least one receptacle (51) is arranged in a sliding element which may be pulled out of the housing and inserted again, and which has a thermally insulated front wall.

Embodiment 12. Test cell station according to one of the preceding claims, characterized in that a circuit board (26) connected to the connection means (54) is provided in the housing (57).

Embodiment 13. Test cell station according to one of the preceding claims, characterized in that the electrical connection means (54) are extend through a partition wall (22) in the housing (57).

Embodiment 14. Test cell station according to one of the preceding claims, characterized in that the electrical connection means (54) are spring contact pins.

The invention claimed is:

1. A test cell station for at least one electrochemical test cell, comprising:
 a housing;
 at least one receptacle,
  wherein each receptacle of the at least one receptacle has a corresponding receiving space of a corresponding at least one receiving space to receive a corresponding electrochemical test cell of at least one electrochemical test cell inserted into the receptacle;
 a corresponding at least one electrical connection device, wherein each electrical connection device of the at least one electrical connection device is configured to make an electrical connection with the corresponding electrochemical test cell of the at least one electrochemical test cell received into the corresponding receiving space of the at least one receiving space;
 a heat-insulated temperature chamber; and
 a controllable cooling/heating element for setting a temperature in the heat-insulated temperature chamber,
 wherein the at least one the receptacle is arranged in such a way that the at least one receiving space is arranged inside the heat-insulated temperature chamber,
 wherein the controllable cooling/heating element is a Peltier element,
 wherein a first thermal side of the Peltier element is in thermal communication with the heat-insulated temperature chamber and a second thermal side of the Peltier element is in thermal communication with an exterior of the heat-insulated temperature chamber,
 wherein:
  a first cooling element is thermally conductively connected to the first thermal side of the Peltier element, and/or
  a second cooling element is thermally conductively connected to the second thermal side of the Peltier element, and
 wherein:
  a first fan is provided inside the heat-insulated temperature chamber and assigned to the first cooling element, and/or
  a second fan is provided in the exterior of the heat-insulated temperature chamber and assigned to the second cooling element.

2. The test cell station according to claim 1, further comprising:
 at least one battery testing device with a corresponding at least one controllable potentiostat and/or galvanostat, such that each receptacle of the at least one the receptacle is provided with a corresponding battery testing device of the at least one battery testing device.

3. The test cell station according to claim 2,
 wherein the at least one battery testing device is arranged inside the housing and outside the heat-insulated temperature chamber.

4. The test cell station according to claim 2,
 wherein each battery testing device of the at least one battery testing device has a corresponding controllable electronic switching matrix of a corresponding at least one controllable electronic switching matrix, with which terminals of the corresponding potenttiostat and/or galvanostat of the at least one potenttiostat and/or galvanostat may be connected arbitrarily to terminals of the corresponding receptacle of the at least one receptacle.

5. The test cell station according to claim 3,
 wherein each battery testing device of the at least one battery testing device has a corresponding controllable electronic switching matrix of a corresponding at least one controllable electronic switching matrix, with which terminals of the corresponding potenttiostat and/or galvanostat of the at least one potenttiostat and/or galvanostat may be connected arbitrarily to terminals of the corresponding receptacle of the at least one receptacle.

6. The test cell station according to claim 2,
 wherein each battery testing device of the at least one battery testing device comprises a corresponding digital control device of a corresponding at least one digital control device, for controlling the corresponding potenttiostat and/or galvanostat of the at least one potenttiostat and/or galvanostat, and/or the corresponding controllable electronic switching matrix of the at least one controllable electronic switching matrix.

7. The test cell station according to claim 5,
wherein each battery testing device of the at least one battery testing device comprises a corresponding digital control device of a corresponding at least one digital control device, for controlling the corresponding potenttiostat and/or galvanostat of the at least one potenttiostat and/or galvanostat, and/or the corresponding controllable electronic switching matrix of the at least one controllable electronic switching matrix.

8. The test cell station according to claim 7,
wherein the controllable cooling/heating element is a Peltier element, and
wherein a first thermal side of the Peltier element is in thermal communication with the heat-insulated temperature chamber and a second thermal side of the Peltier element is in thermal communication with an exterior of the heat-insulated temperature chamber.

9. The test cell station according to claim 1,
wherein a temperature sensor and a thermostat are provided for controlling the controllable cooling/heating device.

10. The test cell station according to claim 8,
wherein a temperature sensor and a thermostat are provided for controlling the controllable cooling/heating device.

11. The test cell station according to claim 1,
wherein a thermally insulated, adjustable flap for opening or closing an opening in the heat-insulated temperature chamber is attached to the housing.

12. The test cell station according to claim 1,
wherein the at least one receptacle is arranged in a sliding element which may be pulled out of the housing and inserted again, and
wherein the sliding element has a thermally insulated front wall.

13. The test cell station according to claim 1,
wherein a circuit board connected to the at least one electrical connection device is provided in the housing.

14. The test cell station according to claim 1,
wherein the at least one electrical connection device extends through a partition wall in the housing.

15. The test cell station according to claim 1,
wherein the at least one electrical connection device comprises spring contact pins.

* * * * *